United States Patent [19]

Igarashi et al.

[11] Patent Number: 5,451,871

[45] Date of Patent: Sep. 19, 1995

[54] PICK-UP COIL ASSEMBLIES AND SYSTEM FOR USE IN A MULTI-CHANNEL SQUID MAGNETOMETER

[75] Inventors: Yutaka Igarashi, Yokohama; Takao Goto; Takehiko Hayashi, both of Kawasaki, all of Japan

[73] Assignee: Fujitsu Limited, Kawasaki, Japan

[21] Appl. No.: 550,691

[22] Filed: Jul. 10, 1990

[30] Foreign Application Priority Data

Jul. 10, 1989 [JP] Japan .................................. 1-178858
Aug. 30, 1989 [JP] Japan .................................. 1-223869

[51] Int. Cl.⁶ .......................................... G01R 33/035
[52] U.S. Cl. ............................ 324/248; 336/DIG. 1
[58] Field of Search ................. 324/248, 242, 243;
 336/180, 185, 196, 199, 200, 207, 208, 225,
 DIG. 1

[56] References Cited

U.S. PATENT DOCUMENTS

| 2,983,865 | 5/1961 | Wenner . | |
| 3,546,580 | 12/1970 | Williams | 336/225 |
| 4,523,147 | 6/1985 | D'Angelo | 324/248 |
| 4,693,000 | 9/1987 | Hoenig | 324/248 |
| 4,749,946 | 6/1988 | Hoenig . | |
| 4,947,118 | 8/1990 | Fujimaki . | |

FOREIGN PATENT DOCUMENTS

0130490A1 7/1983 European Pat. Off. .
0184670A1 11/1984 European Pat. Off. .
0313132A3 10/1987 European Pat. Off. .

OTHER PUBLICATIONS

IEEE Transactions on Electron Devices, vol. 35, No. 12, Dec. 1988, "A Single Chip Squid Magnetometer", by Norio Fujimaki et al., pp. 2412–2418.

IEEE Transactions on Geoscience and Remote Sensing, Jul. 1985, Cryogenic Magnetic Gradiometers for Space Applications, vol. GE-23, No. 4, pp. 552–561, New York US.

Primary Examiner—Walter E. Snow
Attorney, Agent, or Firm—Staas & Halsey

[57] ABSTRACT

A pick-up coil assembly for a multi-channel SQUID magnetometer. The assembly includes a base plate, a plurality of support bars fixedly mounted on the base plate so as to form a matrix, and a plurality of pick-up coil units fixedly mounted on the support bars, each pick-up coil unit having a first and second pick-up coil block. Each of the pick-up coil blocks has a support body, a pair of pick-up coils, connection pads and connection lines. The pair of pick-up coils, the connection pads and the connection lines are formed by a lithography technique on the support body.

14 Claims, 13 Drawing Sheets

FIRST ORDER GRADIOMETER

Fig. 4

SECOND ORDER GRADIOMETER

SECOND ORDER GRADIOMETER

PICK-UP COIL ASSEMBLIES AND SYSTEM FOR USE IN A MULTI-CHANNEL SQUID MAGNETOMETER

CROSS-REFERENCE TO RELATED APPLICATION

The present invention is related to application Ser. No. 07/499,963 filed Mar. 27, 1990 and now U.S. Pat. No. 5,045,788, issued Sep. 3, 1991 and assigned to the common Assignee herein.

BACKGROUND OF THE INVENTION

1. Field of the Invention

The present invention relates to a pick-up coil assembly for a magnetometer using a plurality of super-conducting quantum interference devices (SQUID's). The pick-up coil assembly according to the present invention is constituted by a plurality of pick-up coils arranged in an array configuration (for example, matrix) for enabling multi-channel measurement of magnetic field. The present invention is advantageously utilized for a digital SQUID magnetometer.

2. Description of the Related Art

A SQUID is widely used for detecting a weak magnetic field with very high sensitivity. That is, a SQUID can respond to a change in a weak magnetic field based on a quantum interference effect of the magnetic field. Accordingly, a SQUID is mainly utilized for, particularly, a high sensitivity magnetometer having a pick-up coil assembly as a magnetic sensor. A SQUID magnetometer is utilized, for example, in the medical equipment field to measure the weak magnetic field generated by the heart of a human body.

A detecting stage of the digital SQUID magnetometer (see, FIG. 19) is constituted by a superconductive pick-up coil for detecting a weak magnetic field from an object (human body), a superconductive input coil provided in the SQUID and magnetically coupled to the pick-up coil, and a superconductive feedback coil magnetically coupled to these coils. In general, the pick-up coil assembly is constituted by a plurality of coils (multi-channel), each coil corresponding to one channel, since it is necessary to simultaneously detect the magnetic field over a wide area on the object. For example, about 36 individual pick-up coils are necessary for diagnosing the heart.

In this case, since the pick-up coil assembly must detect a very weak magnetic field without dispersion of characteristics among pick-up coils, it is necessary to assemble the pick-up coil assembly with very high precision, particularly, structural precision so as to have high uniformity among coils.

SUMMARY OF THE INVENTION

The object of the present invention is to provide a pick-up coil assembly for a multi-channel SQUID magnetometer having high precision and high uniformity of characteristics detected among coils.

In accordance with the first aspect of the present invention, there is provided a pick-up coil assembly for a multi-channel SQUID magnetometer, including a base plate, a plurality of support bars fixedly mounted on the base plate so as to form an array configuration, and a plurality of pick-up coil units fixedly mounted on the support bars. Each pick-up coil unit has a first and second pick-up coil block, while each of the blocks has a support body, a pair of pick-up coils, connection pads and connection lines, and the pair of pick-up coils. The connection pads and the connection lines are formed by a lithography technique on the support body.

In the embodiment of the first aspect of the present invention, the pick-up coil assembly includes spacers, each of the spacers being provided between the first and second pick-up coil blocks to insulate between the pick-up coils.

In another embodiment of the first aspect of the present invention, the pair of pick-up coils forms a first order gradiometer.

In still another embodiment of the first aspect of the present invention, the pick-up coil of the first block is cross-connected to that of the second block by superconductive wires so as to form a second order gradiometer.

In still another embodiment of the first aspect of the present invention, the support body includes a penetrating hole along with a longitudinal axis for inserting the support bar.

In the second aspect of the present invention, a pick-up coil assembly for a multi-channel SQUID magnetometer includes a pair of support plates, each support plate having a center penetrating hole and a plurality of penetrating holes arranged in an array configuration, a support bar for fixedly mounting each support plate through the center penetrating hole, and a plurality of coil base plates provided on the support plate. Each coil base plate has a penetrating hole, a pick-up coil and connection pads which are formed by a lithography technique. Also, the second aspect of the present invention has and superconductive wires for connecting between the pick-up coil of the upper support plate and the corresponding pick-up coil of the lower support plate through the penetrating hole so as to form a first order gradiometer.

In the embodiment of the second aspect of the present invention, the two pairs of the support plates are provided so as to form a second order gradiometer by connecting the pick-up coils of four support plates using the superconductive wires.

In the third aspect of the present invention, a pick-up coil assembly for a multi-channel SQUID magnetometer includes a pair of support plates, each support plate having a center penetrating hole; a support bar for fixedly mounting each support plate through the center penetrating hole, and a plurality of pick-up coils arranged on each support plate in an array configuration, each of the pick-up coils being formed by a lithography technique on the support plate. The third aspect of the present invention also includes and superconductive wires for connecting between the pick-up coil of the upper support plate and the corresponding pick-up coil of the lower support plate through a penetrating hole so as to form a first order gradiometer.

DESCRIPTION OF THE PREFERRED EMBODIMENT

Before describing the preferred embodiment, an explanation will be given of two conventional types of pick-up coil assembly used as a multi-channel SQUID magnetometer.

Figure 1:
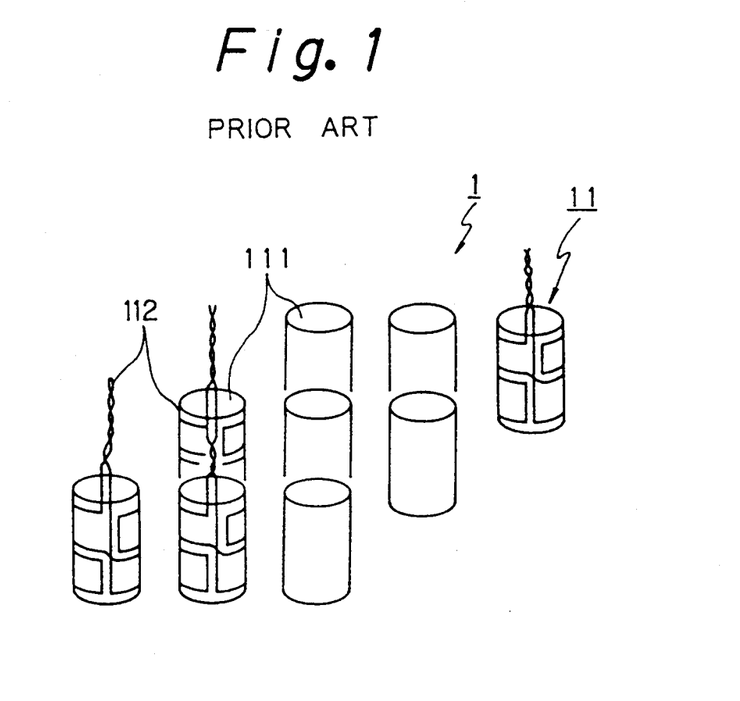
FIG. 1 is one example of a conventional pick-up coil assembly for a multi-channel SQUID magnetometer.

FIG. 1 is one type of a conventional pick-up coil assembly. This type of pick-up coil assembly 1 is constituted by a plurality of pick-up coils 11. Each of pick-up coils 11 has a coil bobbin 111 and a superconductive wire 112. The coil bobbin 111 is made of a non-magnetized material.

Figure 3:
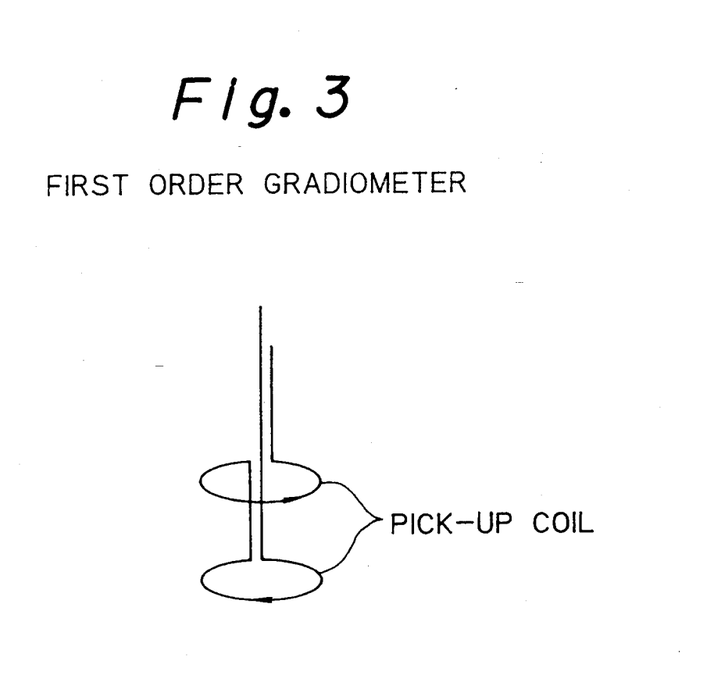
FIG. 3 is a basic form of a first order gradiometer.
Figure 4:
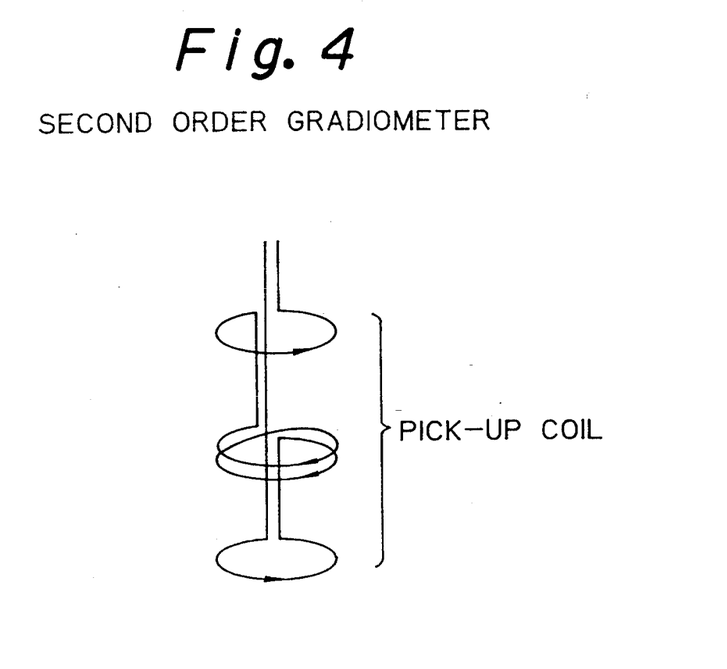
FIG. 4 is a basic form of a second order gradiometer.

In this case, the superconductive wire 112 is manually wound on the coil bobbin 111 along with a groove (not shown) to form the first or second order gradiometer shown in FIG. 3 or FIG. 4.

In a manufacturing process of the above pick-up coil assembly, however, it is very difficult to obtain high uniformity among coils so that this winding work wastes much time. Further, since the magnetic field from the human body is very weak, it is necessary to manufacture the pick-up coil with very high structural precision for sufficiently eliminating environmental magnetic noises. Since the intensity of the magnetic field from the heart is on the order of about $10^{-6}$ (gauss), it is necessary to ensure the structural precision in line with the above intensity. However, limitation of structural precision of this type is about $10^{-3}$ so that it is necessary to measure weak magnetic field in a magnetically shielded room which can completely eliminate environmental magnetic noises.

Figure 2:
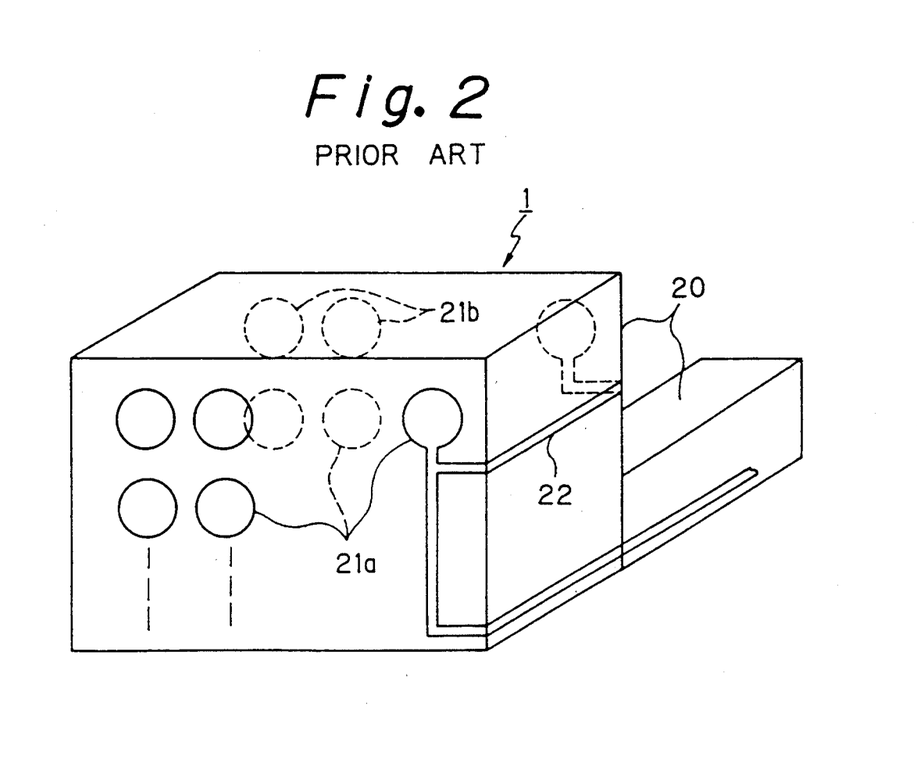
FIG. 2 is another example of a conventional pick-up coil assembly for a multi-channel SQUID magnetometer.

FIG. 2 is another example of a conventional pick-up coil assembly for a multi-channel SQUID magnetometer. This type of the pick-up coil assembly is disclosed in Japanese Unexamined Patent Publication (Kokai) No. 59-133474 (corresponding U.S. Pat. No. 4,749,946).

This type of the pick-up coil assembly 1 is constituted by a support body 20 and a plurality of pick-up coils 21a and 21b provided on the support body 20. In this case, the pick-up coils 21b are provided on opposite surfaces of the pick-up coil 21a, and connected thereto by a connection line 22.

In this case, each of pick-up coils 21a and 21b are formed by a lithography technique which is widely utilized in the field of integrated circuit (IC) manufacturing.

There are, however, some problems in the manufacturing process using the lithography technique as explained in detail below.

First, in general, in the case of the diagnosis of the heart, it is necessary to provide 36 individual pick-up coils to detect the weak magnetic field from the heart. In this case, the 36 coils are arranged in a matrix of 6 (columns)×6 (rows). Accordingly, since the diameter of one pick-up coil is about 2 to 3 (cm), the size of one surface of the support body 20 becomes 15 (cm)×15 (cm) to provide the pick-up coil assembly. However, it is difficult to provide a large lithography device which can print such large numbers of lithography patterns (i.e., a plurality of pick-up coils 21a and 21b) on both surfaces of the support body 20.

Second, it is difficult to provide the lithography patterns connecting between the pick-up coils 21a and 21b (i.e., connection lines 22) because very fine adjustment of the position is necessary for printing the above patterns in an additional manufacturing process.

Third, as explained above, at least the surface area of 15 (cm)×15 (cm) is necessary for diagnosing the heart. However, it is very difficult to provide uniformity among all of the pick-up coils, particularly, if the pick-up coils are printed on four corners.

The pick-up coil assembly according to the present invention is explained in detail hereinafter with reference to the accompanying drawings.

Figure 5:
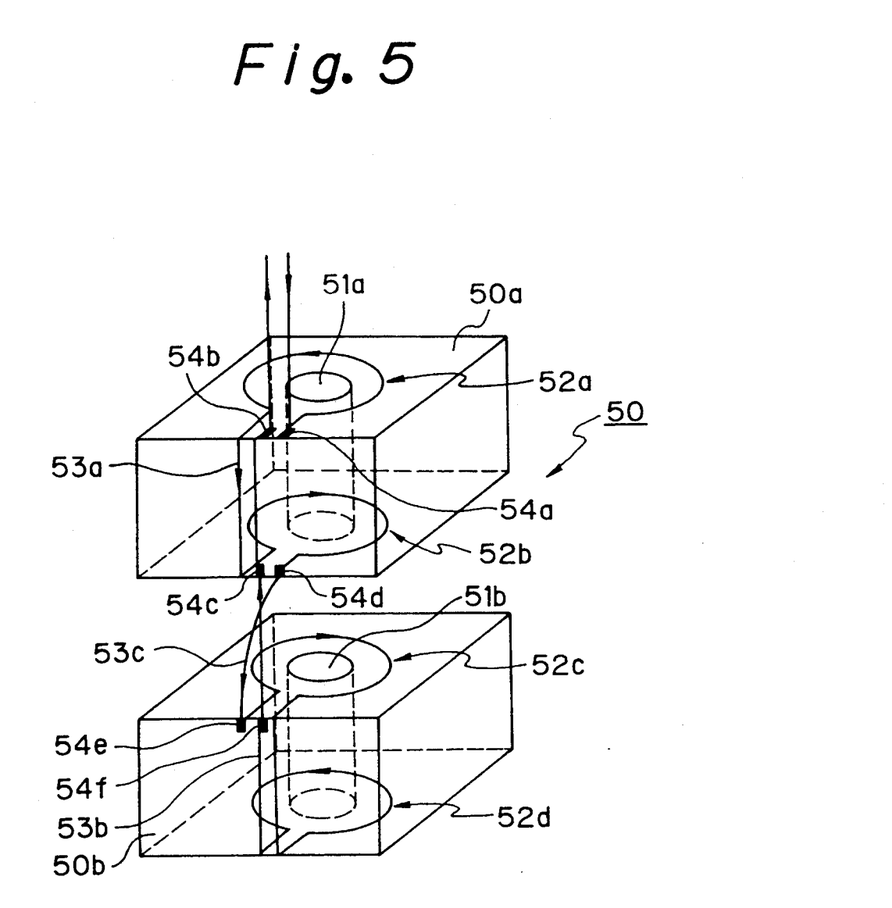
FIG. 5 is a schematic view of a pick-up coil unit according to an embodiment of the present invention.

FIG. 5 is a schematic view of a pick-up coil unit according to an embodiment of the present invention. In FIG. 5, the pick-up coil unit is constituted by a first and second pick-up coil blocks. In the first and second block, 50a and 50b denote support bodies made of, for example, glass block or bulk of silicon. Each of the support bodies 50a and 50b has a square configuration in a sectional view, and comprises penetrating holes 51a and 51b along a longitudinal axis thereof.

The support body 50a comprises only one pair of the pick-up coil 52a and 52b on both plane surfaces around the penetrating hole 51a. That is, the first order gradiometer is formed by a pair of pick-up coil 52a and 52b. The support body 50b including a pair of pick-up coil 52c and 52d has the same structure as the support body 50a.

In this case, these pick-up coils 52a, 52b, and 52c, 52d are made by the lithography technique through the manufacturing process as shown in detail in FIG. 8. The upper pick-up coil 52a is connected to the lower pick-up coil 52b through the connection line 53a printed by the lithography technique. Similarly, the upper pick-up coil 52c is connected to the lower pick-up coil 52d through the connection line 53b printed by the lithography technique. In this case, the lithography technique of the connection lines 53a and 53b is not so difficult to manufacture because the support bodies 50a and 50b are very small.

Further, it is not difficult to obtain a flatness between the upper coil 52a and the lower coil 52b in the body 50a, and between the upper coil 52c and the lower coil 52d in the body 50b because the support bodies 50a and 50b are very small. Further, it is not difficult to obtain uniformity among the coils because the same mask pattern used for the first pick-up coil is used for manufacturing a plurality of pick-up coils.

Further, the pick-up coil 52b of the upper block 50a is cross-connected to the pick-up coil 52c of the lower block 50b through the superconductive line 53c so as to form the second order gradiometer as shown in FIG. 4. In FIG. 5, 54a to 54f denote connection pads. The pad 54a is connected to an input stage (see, FIG. 19) of the magnetometer, the pad 54b is connected to the pad 54c, the pad 54c is connected to the pad 54f, and the pad 54d is connected to the pad 54e.

In this case, the connection pads 54a–54f are is also formed by the lithography technique, and the connection between the pads is effected by a superconductive soldering or screw for a superconductive line. In the drawing, arrows denote the direction of the current flowing in the pick-up coil. The pick-up coil unit according to an embodiment of the present invention is formed as explained above.

The pick-up coil assembly according to the present invention is constituted by a plurality of pick-up coil units 50 shown in FIG. 5, by arranging the pick-up coil units in the matrix configuration as explained in detail hereinafter.

Figure 6:
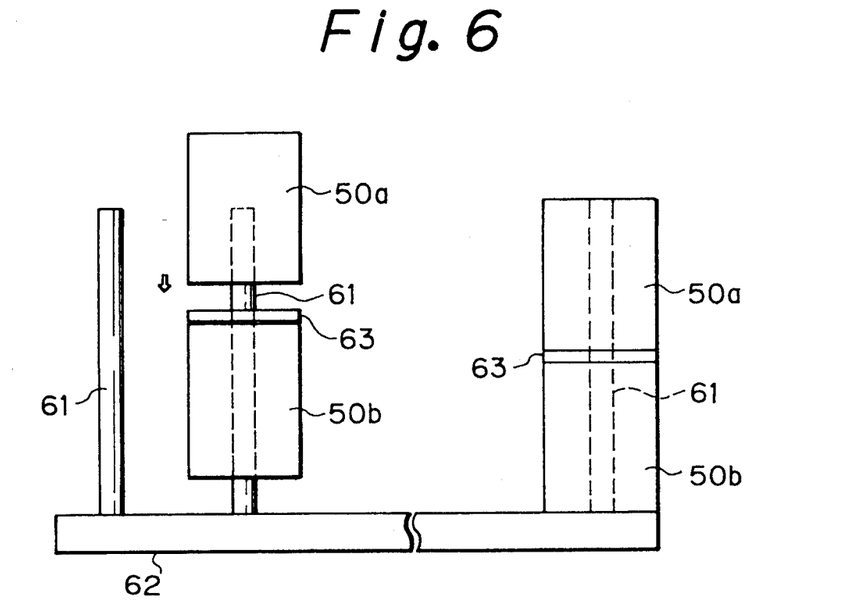
FIG. 6 is a view for explaining the assembly steps of the pick-up coil assembly shown in FIG. 6.

FIG. 6 is a view for explaining assembly steps of the pick-up coil assembly according to an embodiment of the present invention. In FIG. 6, 61 denotes a bar. 63 denotes a spacer for insulating between pick-up coils. A plurality of bars 61 are fixedly arranged in a base plate 62 in a matrix configuration.

In the assembling steps, first, the support body 50b is inserted onto the bar 61 through the penetrating hole 51b; second, the spacer 63 is inserted onto the bar 61; third, the support body 50a is inserted onto the bar 61 through the penetrating hole 51a; finally, the pick-up coil 52b is connected to the pick-up coil 52c as explained above, then, the support bodies 50a and 50b are integrated as the pick-up unit 50.

Figure 7:
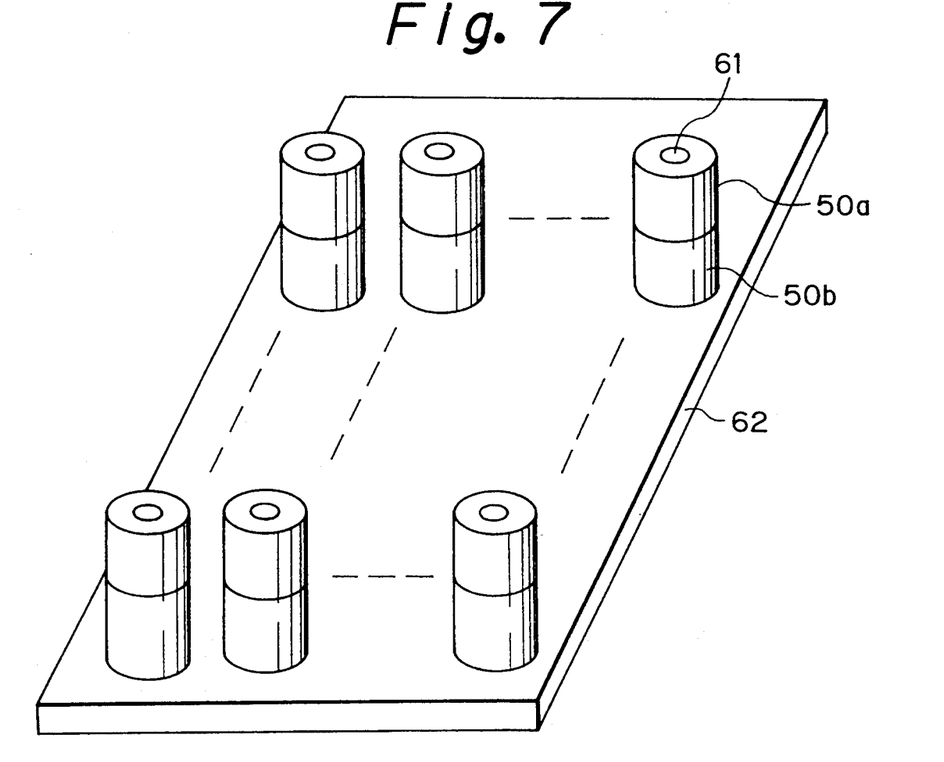
FIG. 7 is a schematic view of the pick-up coil assembly according to an embodiment of the present invention.

FIG. 7 is a schematic view of the pick-up coil assembly according to an embodiment of the present invention. As shown in the drawing, a plurality of the pick-up coil units 50 are arranged in the matrix configuration so as to form the pick-up coil assembly having, for example, 36 (6×6) pick-up coil units.

FIGS. 8A to 8G are views for explaining a manufacturing process of the pick-up coil using the lithography technique. In FIGS. 8A to 8G, 80 denotes a niobium (Nb) thin layer, 81 a resist layer, and 82 a mask film.

Figure 8A:
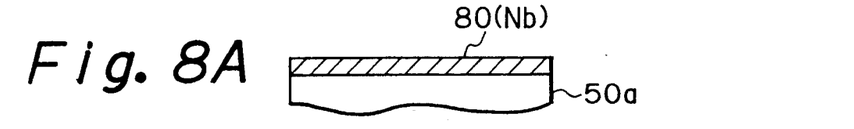
FIGS. 8A to 8G are views for explaining the manufacturing process of the pick-up coil using the lithography technique.

In FIG. 8A, the niobium thin layer 80 is formed on the glass (or silicon: Si) body 50a by using a sputtering method.

Figure 8B:
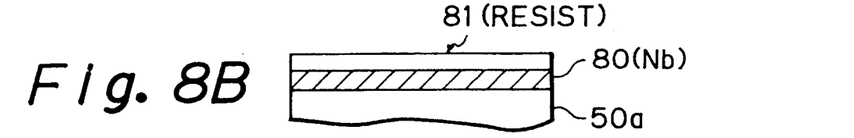

In FIG. 8B, the resist material is spread on the niobium thin layer 80, the spread resist material is baked to be harden by using a pre-bake method, and the resist layer 81 is formed on the glass body 50a.

Figure 8C:
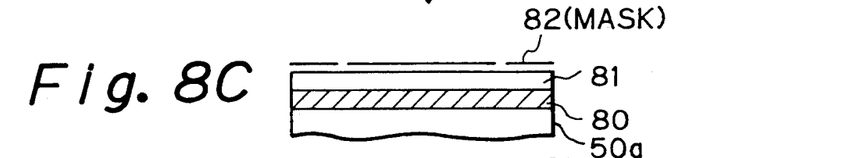

In FIG. 8C, the mask film 82 having the pattern of the pick-up coil is put on the resist layer 81.

Figure 8D:
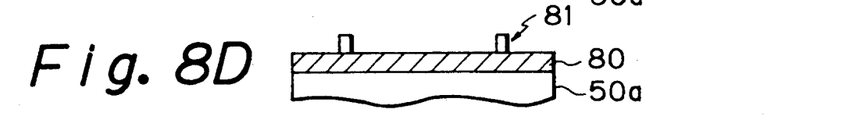

In FIG. 8D, after exposing, developing and heating are performed by using a post-bake method so that the resist layer 81 remains along with the pattern of the pick-up coil 52a.

Figure 8E:
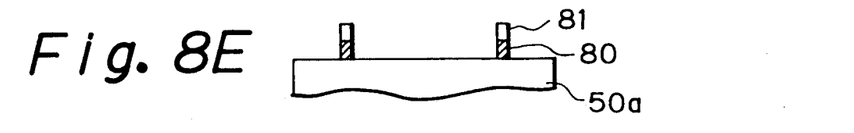

In FIG. 8E, the niobium thin layer 80 which is not covered by the resist layer 81 is eliminated by using a dry-etching method.

Figure 8F:
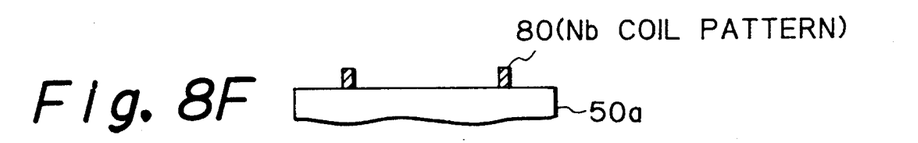

In FIG. 8F, the resist layer 81 is eliminated by a solvent, for example, an acetone solvent, and only the niobium thin layer 80 is formed on the glass body 50a.

Figure 8G:
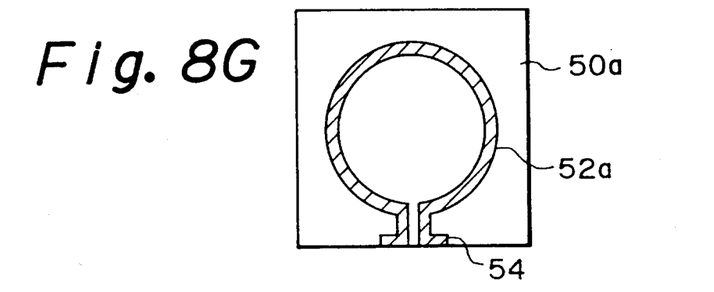

In FIG. 8G, finally, the pick-up coil 52a having the desired configuration is formed on the glass body 50a.

The same manufacturing process as above is repeatedly performed for all surfaces of the glass bodies 50a and 50b.

Figure 9:
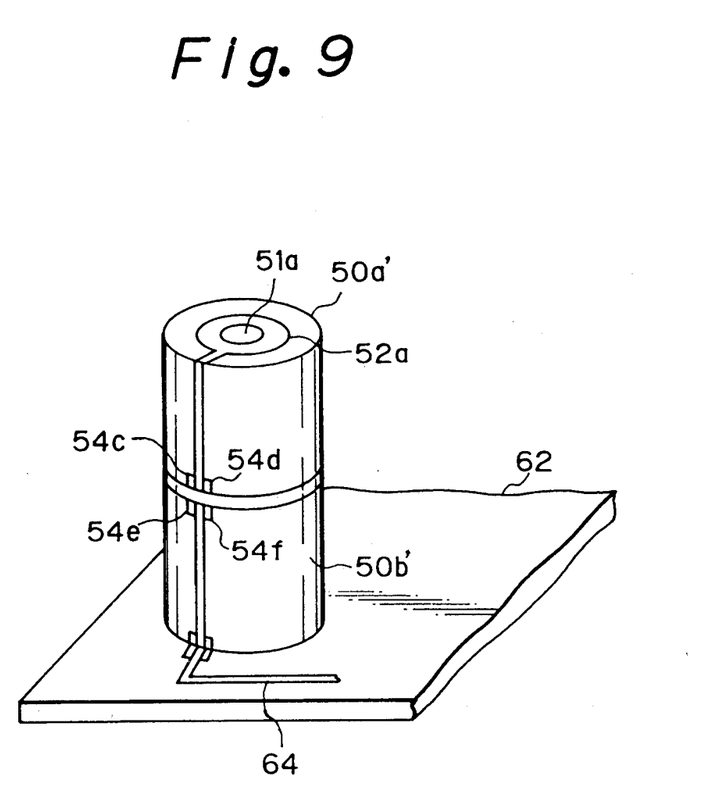
FIG. 9 is a view for explaining a wire pattern on a base plate.

FIG. 9 is a view for explaining a wire pattern on the base plate. The wire pattern 64 is formed by a printed circuit technique on the base plate 62.

Figure 10A:
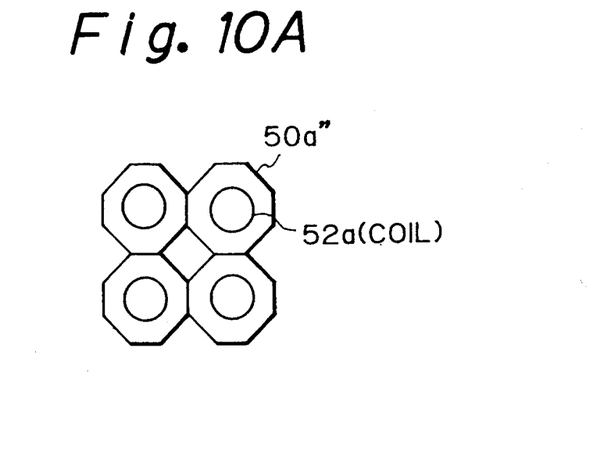
FIGS. 10A to 10C are still another embodiment of the support body shown in FIG. 5.
Figure 10B:
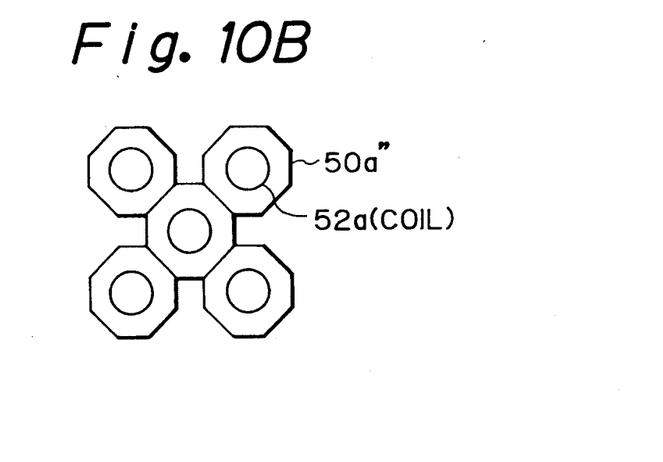
Figure 10C:
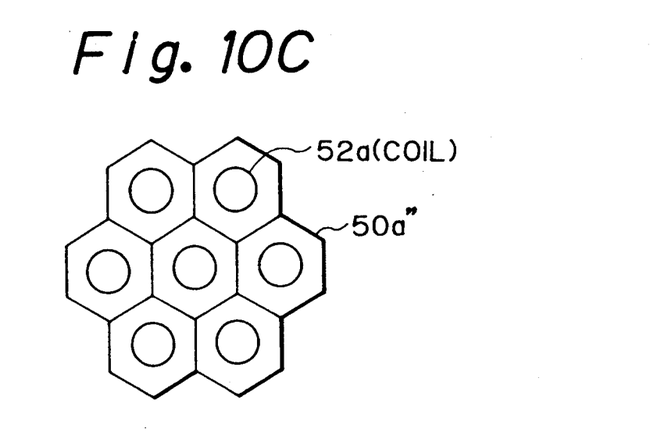

FIGS. 10A to 10C are still another embodiment of the support body shown in FIG. 5. As shown in FIGS. 10A to 10C, the support body $5a''$ is formed by an octagonal or hexagonal configuration.

Figure 11:
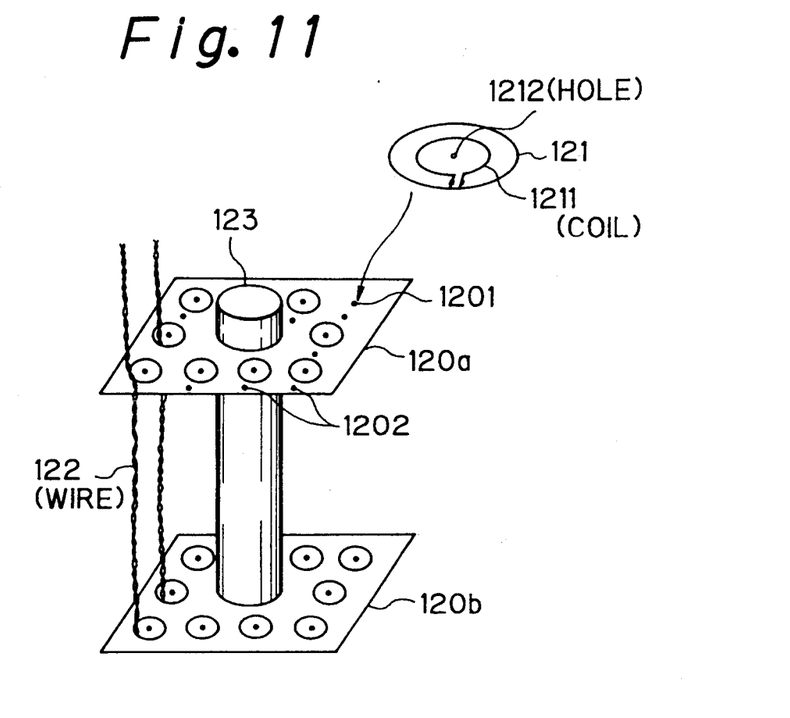
FIG. 11 is a schematic view of a pick-up coil assembly according to another embodiment of the present invention.

FIG. 11 is a schematic view of a pick-up coil assembly according to another embodiment of the present invention. In FIG. 11, 120a and 120b denote support plates. Each support plate 120a and 120b has a plurality of holes 1201 and 1202. The holes 1201 are used for positioning, and the holes 1202 are used for connection.

121 denotes a coil base plate having a pick-up coil 1211 and a small hole 1212. A plurality of the coil base plates 121 are arranged on the support plates 120a and 120b in a matrix form. In the arrangement of the coil base plate 121, the small hole 1212 coincides with the hole 1201 on the support plate 120a and 120b.

122 denotes a superconductive wire. The upper pick-up coil 1211 is connected to the corresponding pick-up coil on the support plate 120b by using the superconductive wire 122 through the hole 1202.

123 denotes a support bar for fixedly supporting the support plates 120a and 120b. The structure of each part is explained in detail hereinafter.

Figure 12:
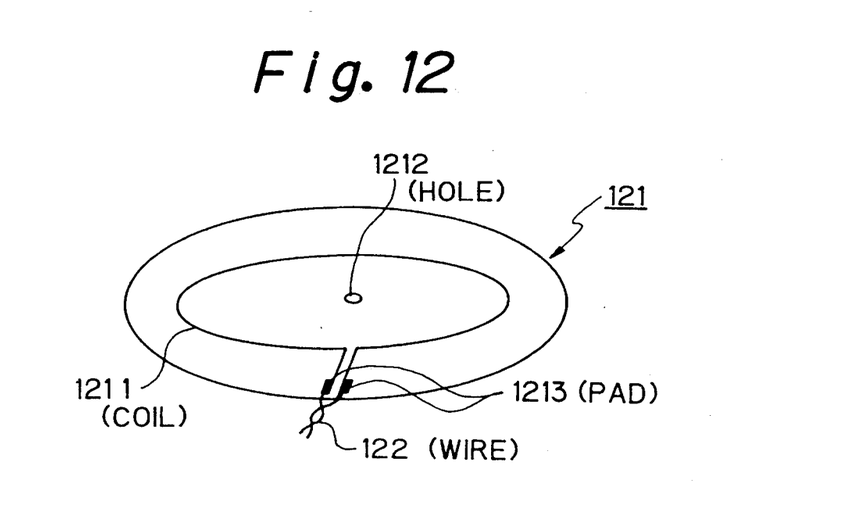
FIG. 12 is a detailed view of the coil base plate 121 shown in FIG. 11.

FIG. 12 is a detailed view of the coil base plate 121 shown in FIG. 11. As explained above, the coil base plate 121 has the pick-up coil 1211 formed by the lithography technique and the small hole 1212. Further, the coil base plate 121 has pads 1213 connected to the pick-up coil 1211. The pad 1213 is simultaneously formed by the lithography technique and connected to the superconductivity wire 122. The small hole 1212 is provided on the center of the coil base plate 121 for obtaining precise arrangement on the support plates 120a and 120b.

Figure 13A:
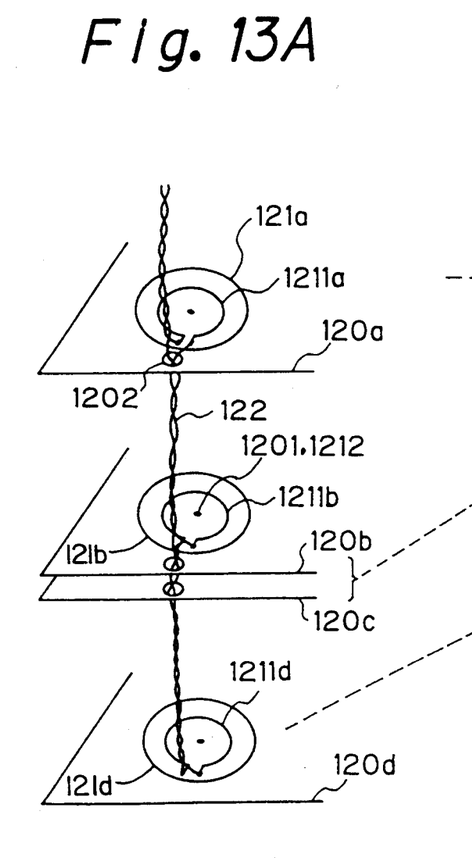
FIGS. 13A and 13B are views for explaining a second order gradiometer according to another embodiment of the present invention.
Figure 13B:
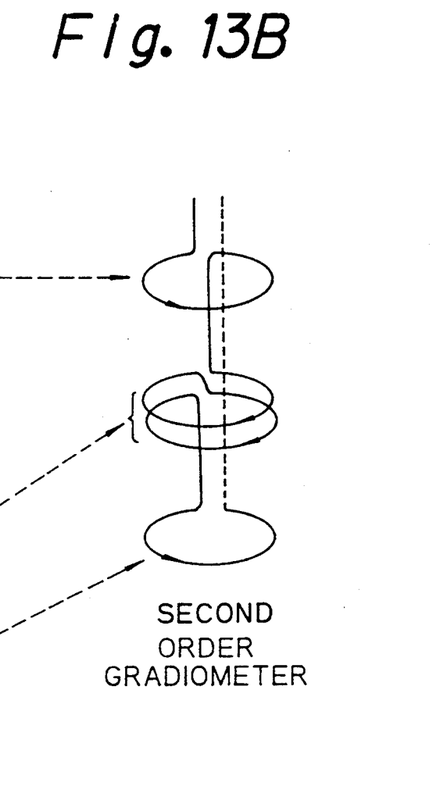

FIGS. 13A and 13B are views for explaining a second order gradiometer according to this embodiment. To form the second order gradiometer, four sets of the coil base plates 121a to 121d are provided on each of four support plates 120a to 120d. Four pick-up coils 1211a to 1211d are cross-connected by the superconductive wire 122 through each hole 1202 on each support plate 120a to 120c so as to form the second order gradiometer as shown in FIG. 13B.

Figure 14:
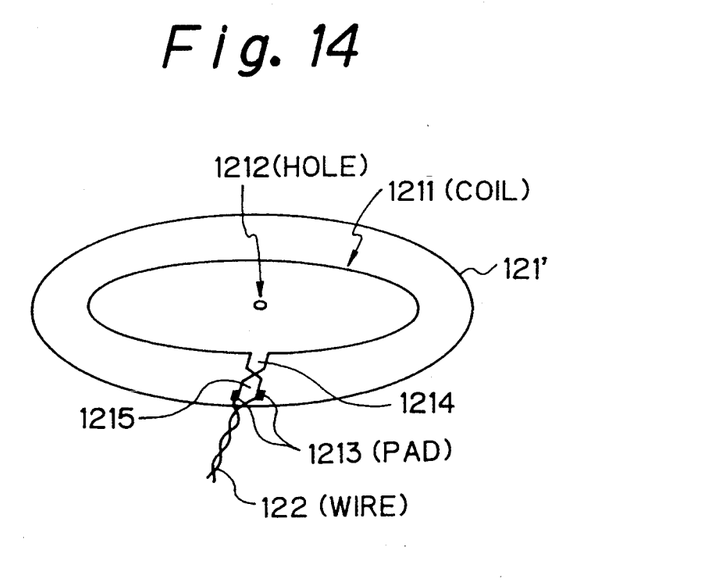
FIG. 14 is another example of the coil base plate according to the present invention.

FIG. 14 is another example of the coil base plate according to the present invention. In FIG. 14, the coil base plate 121' is of the same structure as shown in FIG. 12. However, as shown in the drawing, the end of the loop is cross-connected to the pad 1213 so as to form spaces 1214 and 1215. In this case, the spaces 1214 and 1215 have the same size. Accordingly, it is possible to prevent magnetic noise by this cross-connection.

Figure 15:
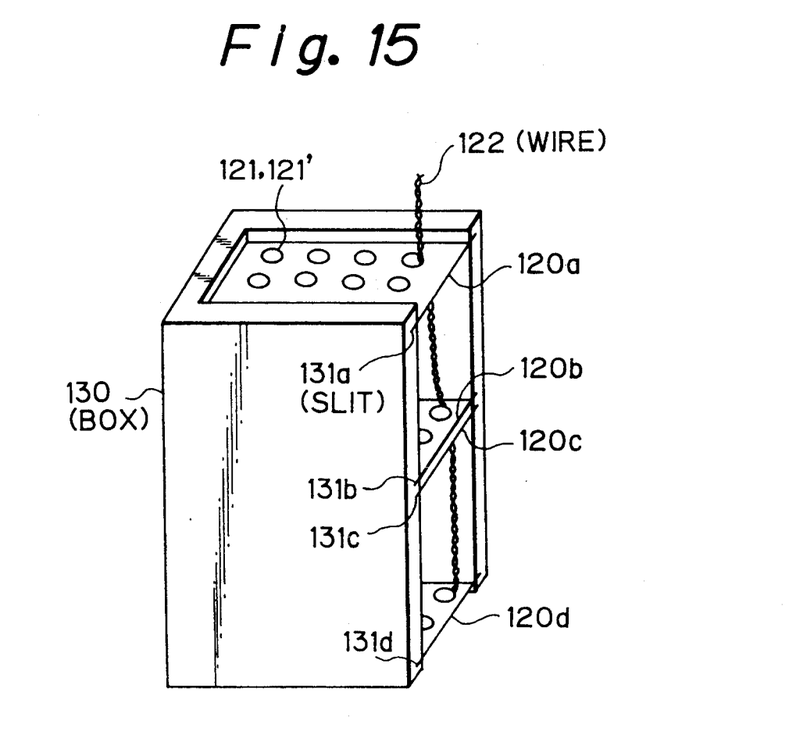
FIG. 15 is another example of the supporting structure of FIG. 11.

FIG. 15 is another example of the supporting structure of FIG. 11. In FIG. 15, 130 denotes a support box having a plurality of slits 131a to 131d for inserting the support plates 120a to 120d. Accordingly, each of the support plates 120a to 120d can be fixedly supported by the slits. This type constitutes the second order gradiometer.

Figure 16:
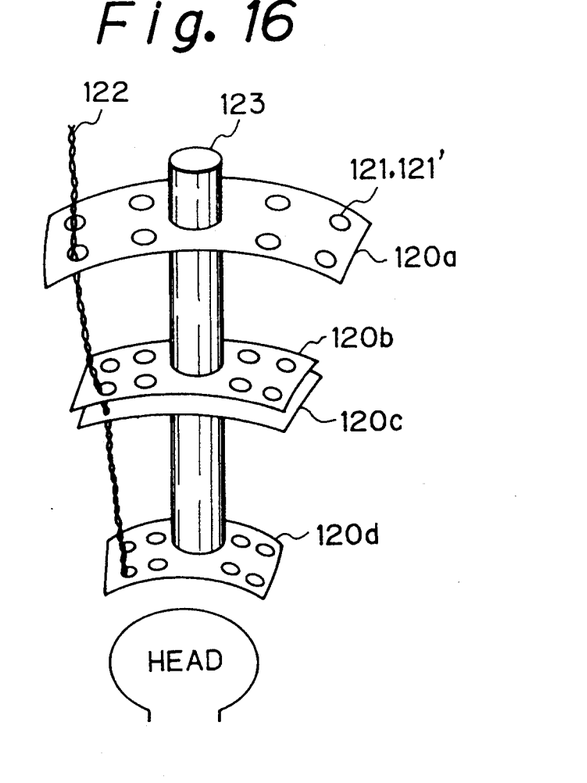
FIG. 16 is still another example of the support plate shown in FIG. 11.

FIG. 16 is still another example of the support plate. As shown in the drawing, each of support plates 120a to 120d are curved. In this case, the support plate is previously curved so as to fit against the surface of an object, for example, the head of a human body. After this process, a plurality of the coil base plates 121 are provided on the support plates 120a to 120d.

Figure 17:
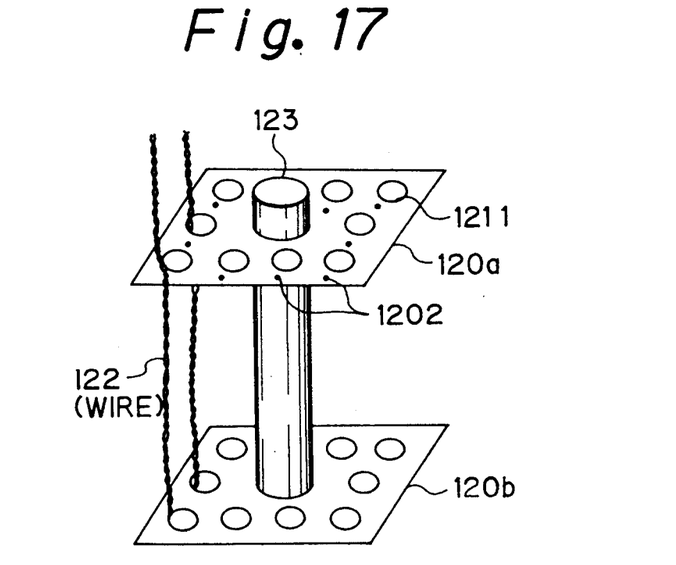
FIG. 17 is a schematic view of a pick-up coil assembly according to still another embodiment of the present invention.

FIG. 17 is a schematic view of a pick-up coil assembly according to still another embodiment of the present invention. In FIG. 17, 120a and 120b denote support plates. A plurality of pick-up coils 1211 are directly formed by the same lithography technique as shown by FIGS. 8A to 8G on the support plate 120a and 120b. In this case, the coil base plate 121 is not necessary, and the small hole 1201 is also not necessary on the support plates 120a and 120b. Only the support bar 123 and the superconductive wire 122 are necessary in this pick-up coil assembly.

In this case, the structural precision of this type can be ensured in spite of the large area of the support plate because the support plate 120 is constituted by the glass plate (not the glass block as shown in FIG. 2).

Figure 18:
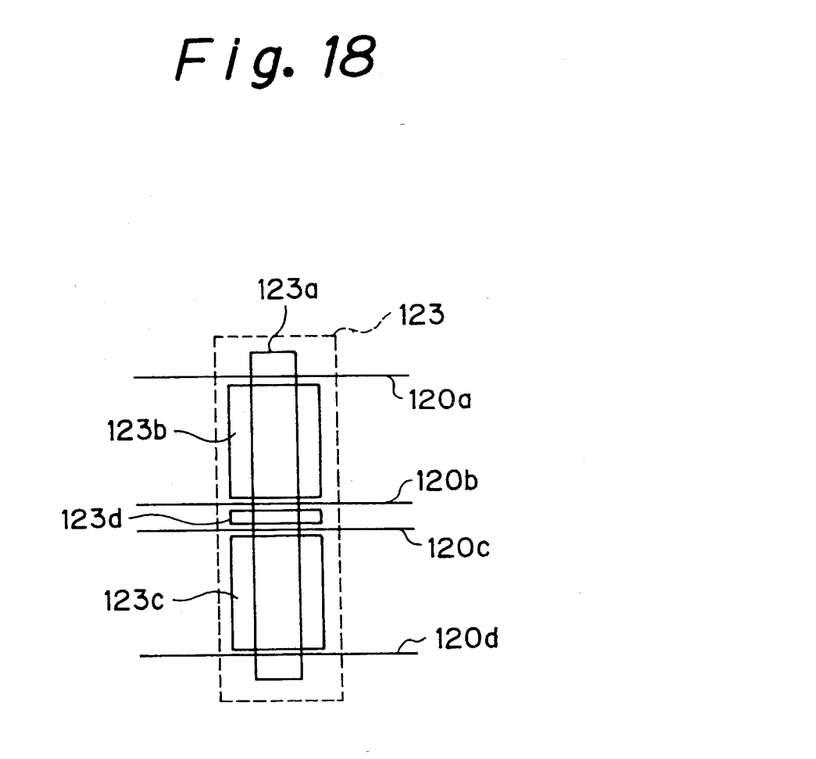
FIG. 18 is a view for explaining the detailed structure of the support bar.

FIG. 18 is a view for explaining a detail structure of the support bar. The support bar 123 is constituted by a center bar 123a, two supplementary bars 123b and 123c, and a spacer 123d. It is possible to ensure the flatness among the support plates 120a to 120d.

Figure 19:
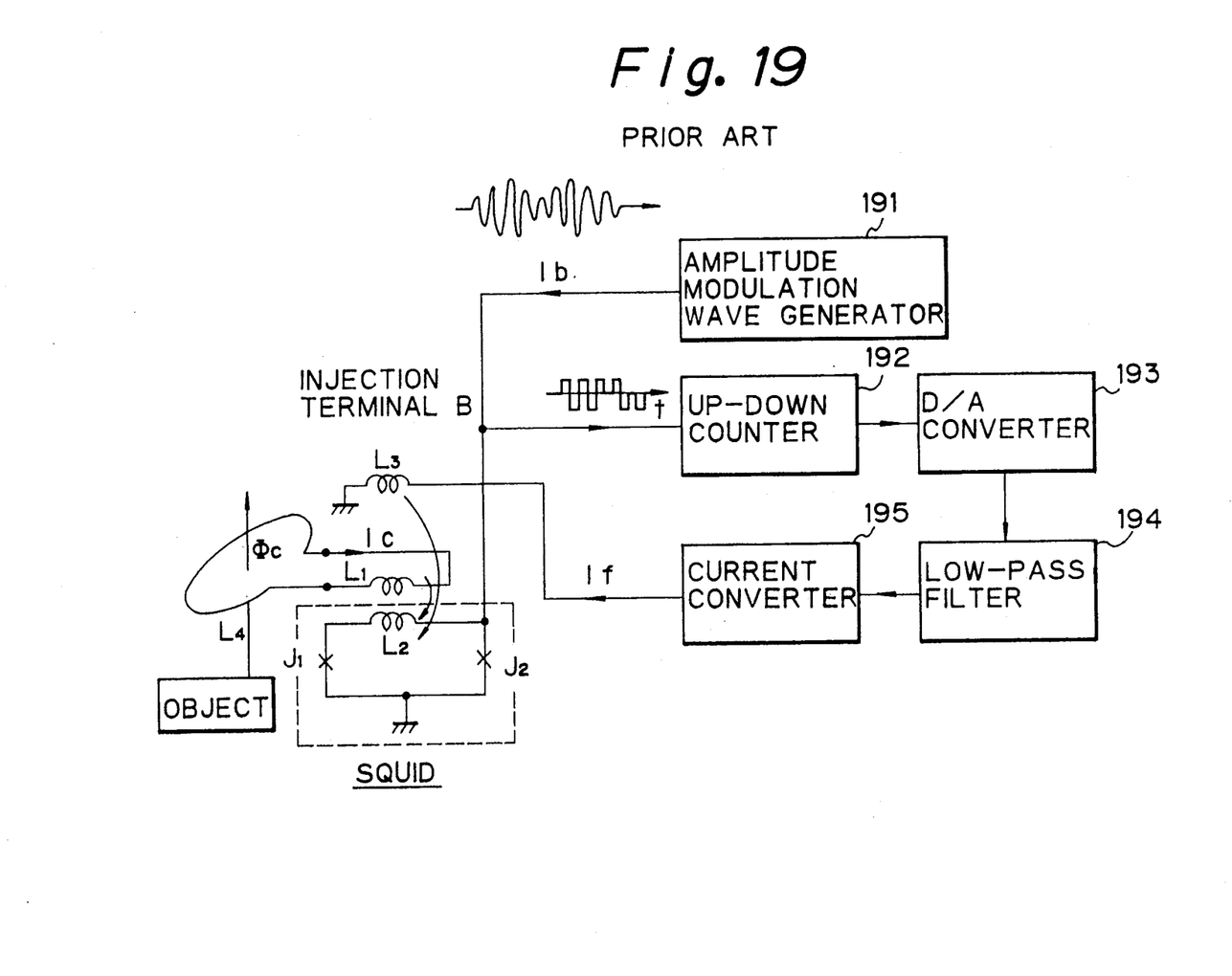
FIG. 19 is a schematic block diagram of a conventional digital SQUID control system used for the digital SQUID magnetometer.

FIG. 19 is a schematic block diagram of a conventional digital SQUID control system used for the digital SQUID mangetometer. In FIG. 19, $L_4$ denotes a pick-up coil. The SQUID is constituted by two Josephson devices and a superconductive coil $L_2$. Further, $L_1$ denotes a superconductive input coil, and $L_3$ denotes a superconductive feedback coil. Reference number 191 denotes an amplitude modulation wave generator, 192 an up-down counter, 193 a digital-to-analog converter, 194 a low-pass filter and 195 a current converter.

The pick-up coil assembly according to the present invention can be applied to the pick-up coil $L_4$. In this drawing, other structural components are of a conventional type. Accordingly, the detailed explanations of each of those components are omitted.

Briefly, the pick-up coil $L_4$ detects weak magnetic field $\Phi_c$ irradiated from the object to be measured. Accordingly, the current flows in input coil $L_1$ in response to change of the magnetic field $\Phi_c$. The coil $L_2$ of the SQUID is arranged in the vicinity of the input coil $L_1$ so as to obtain magnetic coupling with each other. Further, an alternating bias current $I_b$ generated from the generator 191 flows in the SQUID through an injection terminal B. The bias current $I_b$ is superimposed on the current flowing in the SQUID. Reference $I_f$ denotes a feedback current flowing from the converter 195 to the coil $L_3$.

A patent application for the digital SQUID control system explained above has already been filed in the U.S. application Ser. No. 07/499,963 on Mar. 27, 1990, and now U.S. Pat. No. 5,045,788 issued Sep. 3, 1991 and assigned to the common assignee herein, in which the inventors and applicants hereof are coinventors and coapplicants.

We claim:

1. A pick-up coil assembly for a multichannel SQUID magnetometer, comprising:
    a base plate;
    a plurality of support bars fixedly mounted on the base plate so as to form an array configuration; and
    a plurality of pick-up coil units fixedly mounted on the support bars, each pick-up coil unit having first and second pick-up coil blocks, each of the first and second pick-up coil blocks comprising:
    a support body;
    a pair of pick-up coils on the support body;
    a plurality of connection pads on the support body;
    a plurality of connection lines on the support body, coupled between the pair of pick-up coils and the plurality of connection pads, the pair of pick-up coils, the plurality of connection pads and the plurality of connection lines being formed by a lithography technique on the support body.

2. A pick-up coil assembly as claimed in claim 1, further comprising:
    a plurality of spacers, each of the plurality of spacers being provided between the first and second pick-up coil blocks for insulating between the pick-up coils.

3. A pick-up coil assembly as claimed in claim 1, wherein the pair of pick-up coils forms a first order gradiometer.

4. A pick-up coil assembly as claimed in claim 1, wherein the pick-up coil of the first block is cross-connected to that of the second block by a plurality of superconductive wires so as to form a second order gradiometer.

5. A pick-up coil assembly as claimed in claim 1, wherein the support body comprises a penetrating hole along the longitudinal axis thereof for inserting the support bar.

6. A pick-up coil assembly for a multichannel SQUID magnetometer, comprising:
    a first pair of support plates including upper and lower support plates, each of the upper and lower support plates having a center penetrating hole and a plurality of penetrating holes arranged in an array configuration;
    a support bar for fixedly mounting each of the upper and lower support plates of the first pair of support plates through the center penetrating hole;
    a first plurality of coil base plates provided on each of the upper and lower support plates of the first pair of support plates, each of the plurality of coil base plate having a penetrating hole, a pick-up coil and a plurality of connection pads, the pick-up coil and the plurality of connection pads being formed by a lithography technique; and
    a plurality of superconductive wires for connecting between a pick-up coil of the upper support plate and a corresponding pick-up coil of the lower support plate of the first pair of support plates through the penetrating hole so as to form a first order gradiometer.

7. A pick-up coil assembly as claimed in claim 6, further comprising:
    a second pair of support plates each including at least one pick-up coil, provided so as to form a second order gradiometer by connecting the pick-up coils of the first and second pairs of support plates using the plurality of superconductive wires.

8. A pick-up coil assembly for a multichannel SQUID magnetometer, comprising:
- a first pair of support plates including upper and lower support plates, each of the upper and lower support plates having a center penetrating hole;
- a support bar for fixedly mounting each of the upper and lower support plates of the first pair of support plates through the center penetrating hole;
- a plurality of pick-up coils arranged on each of the upper and lower support plates of the first pair of support plates in an array configuration, each of the plurality of pick-up coils being formed by a lithography technique on the support plate; and
- a plurality of superconductive wires for connecting between one of the plurality of pick-up coils of the upper support plate and a corresponding one of the plurality of pick-up coils of the lower support plate of the first pair of support plates through a penetrating hole so as to form a first order gradiometer.

9. A pick-up coil assembly as claimed in claim 8, further comprising:
- a second pair of support plates each including at least one pick-up coil, provided so as to form a second order gradiometer by connecting the pick-up coils of the first and second pairs of support plates using the plurality of superconductive wires.

10. A pick-up coil assembly as claimed in claim 1, wherein the support body includes a bobbin.

11. A pick-up coil assembly as claimed in claim 1, wherein the support body is a silicon block.

12. A pick-up coil assembly as claimed in claim 1, wherein the support body is a glass block.

13. A pick-up coil assembly as claimed in claim 1, wherein the plurality of support bars are formed of a material having a relatively low magnetic permeability.

14. A pick-up coil assembly as claimed in claim 1, wherein the plurality of support bars are formed of a ceramic material.

* * * * *

UNITED STATES PATENT AND TRADEMARK OFFICE
CERTIFICATE OF CORRECTION

PATENT NO. : 5,451,871
DATED : Sep. 19, 1995
INVENTOR(S) : IGARASHI et al.

It is certified that error appears in the above-indentified patent and that said Letters Patent is hereby corrected as shown below:

Col. 2,     line 33, change "has and" to --has--;
            line 52, change "includes and" to --includes--.

Col. 5,     line 20, change "are is" to --are--.

Col. 8,     line 52 (Claim 6, line 14), change "plate" to --plates--;
            line 59 (Claim 6, line 21), after "plates" insert --,--.

Signed and Sealed this

Ninth Day of January, 1996

Attest:

BRUCE LEHMAN

*Attesting Officer*      *Commissioner of Patents and Trademarks*